(12) United States Patent
Taskin et al.

(10) Patent No.: US 9,866,174 B2
(45) Date of Patent: *Jan. 9, 2018

(54) RESONANT FREQUENCY DIVIDER DESIGN METHODOLOGY FOR DYNAMIC FREQUENCY SCALING

(71) Applicant: Drexel University, Philadelphia, PA (US)

(72) Inventors: Baris Taskin, Philadelphia, PA (US); Ying Teng, Philadelphia, PA (US)

(73) Assignee: Drexel University, Philadelphia, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/340,308

(22) Filed: Nov. 1, 2016

(65) Prior Publication Data

US 2017/0047892 A1 Feb. 16, 2017

Related U.S. Application Data

(63) Continuation-in-part of application No. 14/876,038, filed on Oct. 6, 2015, now Pat. No. 9,484,896.

(Continued)

(51) Int. Cl.

| H03K 21/02 | (2006.01) |
|---|---|
| H03K 21/08 | (2006.01) |
| H03K 23/54 | (2006.01) |
| H03K 3/03 | (2006.01) |
| H03B 5/18 | (2006.01) |
| H03B 27/00 | (2006.01) |

(Continued)

(52) U.S. Cl.
CPC ........... *H03B 5/1852* (2013.01); *H03B 27/00* (2013.01); *H03K 3/0315* (2013.01); *H03K 21/02* (2013.01); *H03K 21/08* (2013.01); *H03K 21/10* (2013.01); *H03K 23/54* (2013.01); *H03K 27/00* (2013.01); *H03L 5/00* (2013.01); *H03L 7/00* (2013.01); *H03B 2200/0082* (2013.01)

(58) Field of Classification Search
CPC ........ H03K 23/54; H03K 23/44; H03K 23/42; H03K 21/00; H03K 21/02; H03K 21/08; H03K 27/00; H03K 3/015; H03B 5/18; H03B 27/00

See application file for complete search history.

(56) References Cited

U.S. PATENT DOCUMENTS

| 6,040,725 A | 3/2000 | Lee et al. |
| 6,654,439 B1 | 11/2003 | Kommrusch |

(Continued)

OTHER PUBLICATIONS

John Wood, Terence C. Edwards, Steve Lipa, Rotary Traveling Wave Oscillator Arrays: A New Clock Technology, IEEE Journal of Solid-State Circuits, vol. 36, No. 11, pp. 1654-1665, Nov. 2001, USA.

(Continued)

*Primary Examiner* — Ryan Johnson
(74) *Attorney, Agent, or Firm* — Spruce Law Group, LLC (57) ABSTRACT

A dynamic rotary traveling wave oscillator circuit includes plurality of multi-output spot-advancing blocks (MOSABs) forming a main-loop and a plurality of multi-input spot-advancing blocks (MISABs) forming a sub-loop. Depending on a desired division ratio, a connection connects blocks on the MOSABs and MISABs to create the desired division ratio.

15 Claims, 7 Drawing Sheets

Related U.S. Application Data (60) Provisional application No. 62/060,516, filed on Oct. 6, 2014.

(51) Int. Cl.
   *H03L 7/00*      (2006.01)
   *H03L 5/00*      (2006.01)
   *H03K 21/10*     (2006.01)
   *H03K 27/00*     (2006.01)

(56) References Cited

U.S. PATENT DOCUMENTS

| | | | |
|---|---|---|---|
| 7,812,648 B2 | 10/2010 | Wood | |
| 9,484,896 B2 * | 11/2016 | Taskin | H03B 27/00 |
| 2005/0225365 A1 | 10/2005 | Wood | |
| 2008/0258780 A1 | 10/2008 | Wood | |

OTHER PUBLICATIONS

Vinayak Honkote, Baris Taskin, CROA: Design and Analysis of the Custom Rotary Oscillatory Array, IEEE Transactions on Very Large Scale Integration (VLSI) Systems, vol. 19, No. 10, pp. 1837-1847, Oct. 2011, USA.

Vinayak Honkote, Baris Taskin, ZeROA: Zero Clock Skew Rotary Oscillatory Array, IEEE Transactions on Very Large Scale Integration (VLSI) Systems, Aug. 2012, pp. 1528-1532, vol. 20, No. 8, USA.

Visvesh Sathe, Resonant Clock Design for a Power-Efficient High-Volume x86-64 Microprocessor, 2012 IEEE International Solid-State Circuits Conference, vol. 978-1-4673-0377-4/12, Session 3/Processors/3.7, pp. 68-69, USA.

Ying Teng, Baris Taskin, Synchronization Scheme for Brick-Based Rotary Oscillator Arrays, Proceedings of the ACM Great Lakes Symposium on VLSI (GLSVLSI), May 2012, pp. 117-122.

Ying Teng, Low Power Resonant Rotary Global Clock Distribution Network Design Part 1 of 2, A Thesis Submitted to the Faculty of Drexel University, May 2014, Philadelphia, Pennsylvania, USA.

Ying Teng, Low Power Resonant Rotary Global Clock Distribution Network Design Part 2 of 2, A Thesis Submitted to the Faculty of Drexel University, May 2014, Philadelphia, Pennsylvania, USA.

Jianchao Lu, Vinayak Honkote, Xin Chen, Baris Taskin, Steiner Tree Based Rotary Clock Routing with Bounded Skew and Capacitive Load Balancing, entire document, Department of Electrical and Computer Engineering, Drexel University, Philadelphia, Pennsylvania, USA, Mar. 2011.

Ying Teng, Baris Taskin, Sparse-Rotary Oscillator Array (SROA) Design for Power and Skew Reduction, entire document, Department of Electrical and Computer Engineering, Drexel University, Philadelphia, Pennsylvania, USA, Mar. 2013.

Ying Teng, Jianchao Lu, Baris Taskin, ROA-Brick Topology for Rotary Resonant Clocks, IEEE, 978-1-4577-1954-7/11, pp. 273-278, USA, 2011.

\* cited by examiner

RESONANT FREQUENCY DIVIDER DESIGN METHODOLOGY FOR DYNAMIC FREQUENCY SCALING

STATEMENT REGARDING FEDERALLY SPONSORED RESEARCH

This invention was made with government support under Contract No. 0845270 awarded by the National Science Foundation. The government has certain rights in the invention.

BACKGROUND

A dynamic frequency scaling (DFS) scheme based on resonant rotary clocking may address certain needs:

1) The power savings and the stability of the resonant rotary clocking are directly proportional to its operating frequency; thus, lower frequency implementations of rotary clocking are often inefficient. For instance, when the resonant clocking implementation on AMD Piledriver chip is used at high frequencies, and the clock network is multiplexed off to be driven by a non-resonant clock source for lower frequency modes.

2) While a frequency division circuitry exists for resonant rotary clocking (e.g. not for coupled LC oscillator-based type that is used but for RTWO), the rotary clock frequency divider is a static divider and cannot perform dynamic frequency scaling as targeted in this work for DFS-based architectural design support.

The second challenge listed above refers to prior work on resonant clock frequency division described in US publication 2008/0258780. This describes a circuitry for frequency division designed specifically for the RTWO-based resonant clocking that uses the SABs driven by multi-phases of the rotary clock. As described herein, an RTWO frequency divider design methodology is based on the SAB for dynamic frequency scaling. Using this methodology, an RTWO frequency divider for integer division ratios of 3 to 9 may be realized based on one circuit topology.

SUMMARY OF THE INVENTION

A dynamic rotary traveling wave oscillator circuit includes plurality of multi-output spot-advancing blocks (MOSABs) forming a main-loop and a plurality of multi-input spot-advancing blocks (MISABs) forming a sub-loop. Depending on a desired division ratio, a connection connects blocks on the MOSABs and MISABs to create the desired division ratio.

DETAILED DESCRIPTION OF THE EMBODIMENTS

I. Introduction

The circuit and method described herein may add value to the integration of resonant clocking to system architecture design through enabling DFS.

Figure 1:
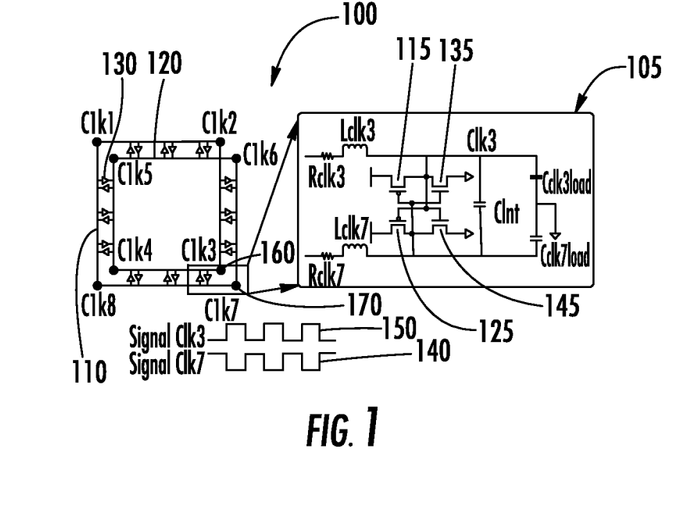
FIG. 1 shows an RTWO Frequency Divider structure.

As shown in FIG. 1, a rotary traveling wave oscillator (RTWO) 100 comprises two differential transmission lines 110, 120 with cross-connections between them to form a Mobius loop. Anti-parallel inverter pairs 130 may be connected between these two transmission lines 110, 120, which are used to overcome the energy loss during the signal propagation. The traveling signals 140, 150 along the transmission lines 110, 120 of the RTWO provide multiple phase signals for sampling, all of which may maintain a duty cycle of 50%.

If point Clk3 160 is defined with clock signal delay t=0 and phase θ=0, the clock signal travels along the RTWO 100 and reaches point Clk7 170 with phase θ=π and back to Clk3 160 with phase θ=2π. The phase delay is evenly distributed along the RTWO transmission line in the wave propagating direction. Thus, the relationship of the time delay and the phase delay is expressed as:

$$\frac{\theta}{2\pi} = \frac{t}{T}, \tag{1}$$

where T is the clock cycle.

The RTWO circuit 100 in FIG. 1 includes a close-up 105 of a corner segment with two inverters 115, 125. Clk3 and Clk7 points of the RTWO 100 are marked on the close-up view 105, as are the parasitic components of the transmission line segments: Rclk3, Lclk3 and Cclk3 load are the resistance, inductance and capacitive load of each wire segment of the transmission line segment in the close-up view, respectively. Cint is the coupling capacitance between the transmission line segments in the inner transmission line 120 (i.e. on which Clk3 point is on) and the outer transmission line 110 (i.e. On which Clk7 point is on). The anti-parallel inverters 115, 125 are shown as inverter symbols on the RTWO FIG. 100 in the zoom out view on the left; on the close-up view on the right, inverters are shown as PMOS and NMOS transistors 135, 145 in order to demonstrate the connectivity of the parasitic components of Rclk3, Lclk3 and Cclk3 load.

Figure 2A:
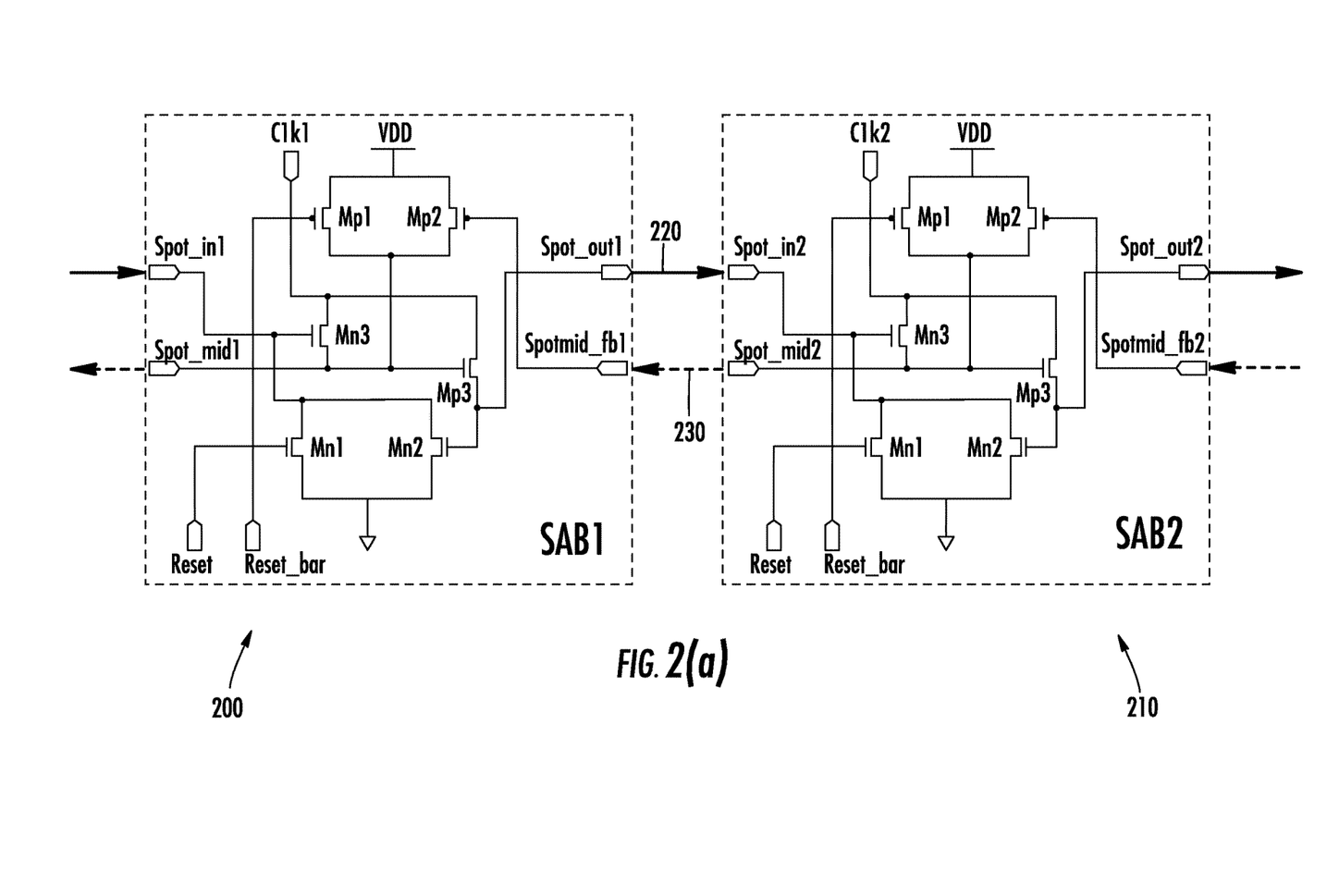
FIG. 2(a) shows a spot-advancing block.
Figure 2B:
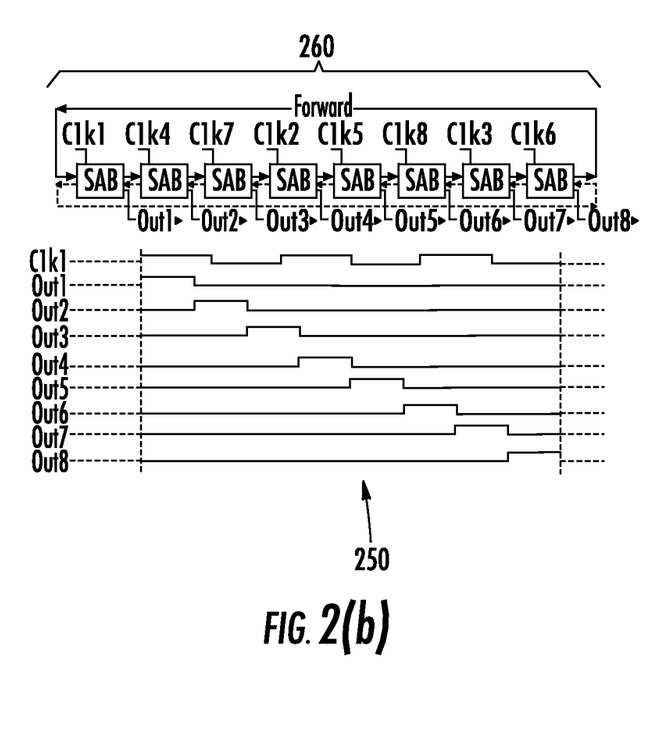
FIG. 2(b) shows an 8 SAB frequency divider.

The circuitry of the spot-advancing blocks (SABs) 200, 210 is shown in FIG. 2(a), which may be the core cell of the RTWO frequency divider 100. The SABs 200, 210 may be used as building blocks to construct a frequency divider, in which the SABs 200, 210 are connected to form a circuit loop. Mp1, Mp2, Mp3 in SAB1 200 and SAB2 210 may be PMOS-type transistors. Mn1, Mn2, Mn3 in SAB1 200 and SAB2 210 are NMOS-type transistors. The Reset may an active reset signal, with reset_bar being the logical inverse of the reset signal. Clk1 may be an input clock phase to SAB1 200 (Clk2 likewise for SAB2), where CLK1 and CLK2 (and other phases to other SABs) can be any desired phase from the RTWO to implement desired functionality of frequency division. Each SAB is assigned with an input clock signal. The input clock signals are of the same frequency and their phases are evenly distributed between 0 to 2π. The number of the input clock signals is set to 8 for illustration purposes, such that a phase delay 1/g*2π is maintained between adjacent input clock signals. There are two signal paths in the SAB circuit loop: (1) The spot 220 in signal path (between the top I/O pair) is used to propagate the signal spot in the forward direction. (2) The spotmid fb signal path 230 (between the bottom I/O pair) is used to clean up the signal spot on the current SAB when the signal has propagated to the next SAB. The topology 250 of an RTWO frequency divider for a division ratio of 3 in is shown in FIG. 2(*b*), which is comprised of 8 SABs 260 driven by 8 input clock signals 270. FIG. 1 shows the locations (Clk1, Clk2, Clk3, Clk4, Clk5, Clk6, Clk7, Clk8) on the RTWO ring 100 from where the multiphase input clock signals are tapped. For a frequency division ratio of 3, the multi-phase clock signals for each SAB in the forward direction are {Clk1, Clk4, Clk7, Clk2, Clk5, Clk8, Clk3, Clk6}.

The dynamic frequency scaling (DFS) of resonant clocking may use a low power clock network employed in the DFS. The circuit and system design, as well as automation research on rotary clocking has not traditionally focused on frequency generation or system-design support for DFS-based power management.

II. Dynamic RTWO Frequency Divider Design

In addition to permitting dynamic scaling, the apparatus and method herein may enhance the practical use of the frequency divider by providing different construction methods for a given division ratio. The proposed design methodology may realize the object division ratio with least number of SABs and dynamically tune the output frequency based on SoC-driven architectural requirements of the DFS scheme.

A. Dynamic RTWO Frequency Divider Circuit Topology

Figure 3:
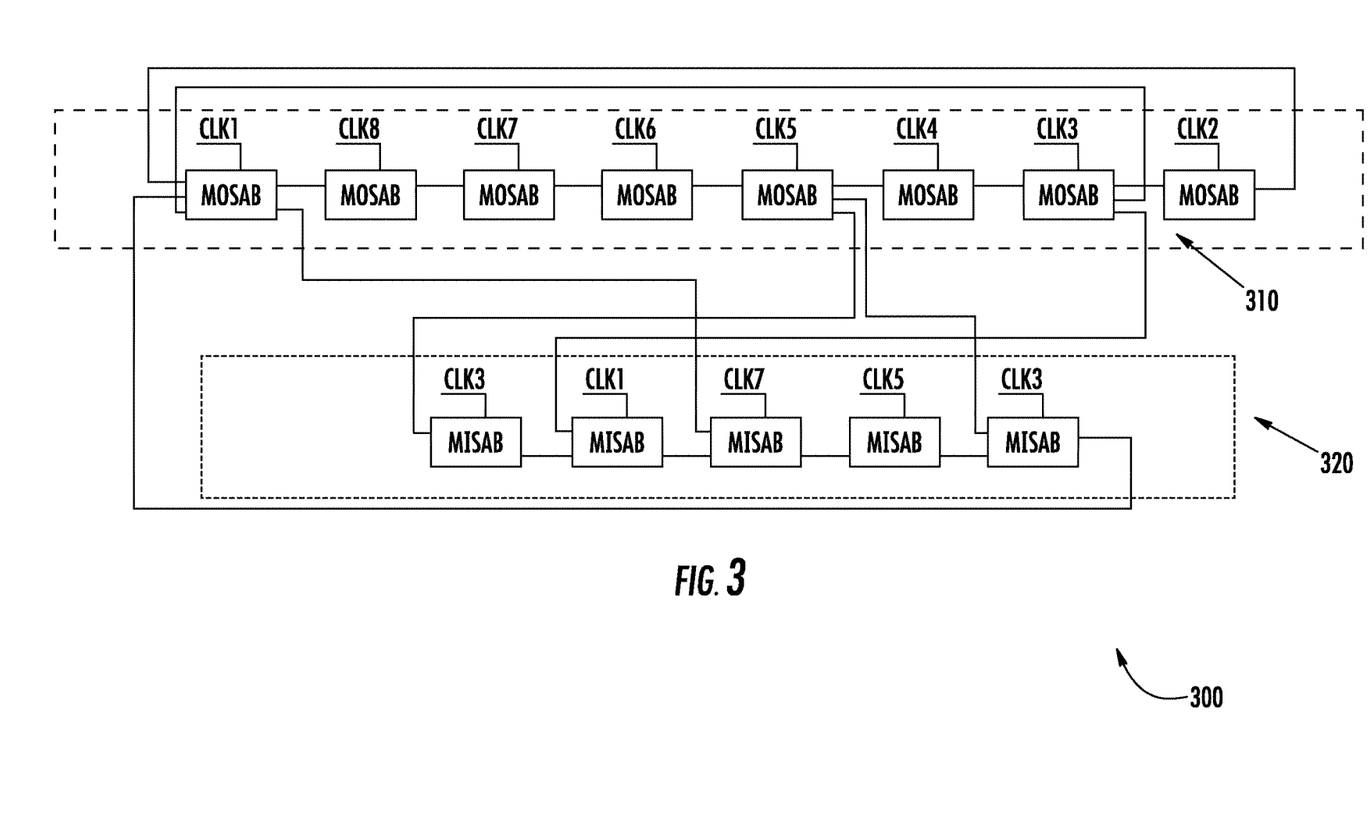
FIG. 3 shows a dynamic frequency divider.

FIG. 3 shows a circuit structure 300 of the RTWO frequency dividers for division ratios of 3 to 9. This circuit 300 is a 13 stage circuit topology, grouped into 8 main loop stages (MOSAB CKL1-8) and 5 sub-loop stages (MISAB CLK 1, 3, 5, 7) for the 13 stages. Not all of these stages are used for all division ratios: A loop is created between the blocks on the main-loop and the blocks on the sub-loop in order to create the desired division ratio. In other words, the division ratios of 3 to 9 is implemented on the 13 stage circuit topology template by controlling the selection of a circuit loop construction between all or a subset of the 13 blocks. In the special case of a division ratio of 7, all 8 blocks on the main loop are selected as the circuit loop, without including any of the sub-loops blocks. By changing the main loop stages, the division value may change and the divider can divide by larger values than 3-9. The theoretical analysis that drives the selection of the smallest number of connections from the template circuit topology in FIG. 3 is presented in Section II-B. Representative designs are presented in Section II-C.

B. Dynamic RTWO Frequency Divider

Given m number of multi-phase input clock signals that drive the main-loop and sub-loop blocks in FIG. 3, the largest phase delay between the clock signals is $(m-1/m)*2\pi$. The blocks in the main-loop 310 are driven by clock phases that are separated by this largest delay of $(m-1/m)*2\pi$. The phase delays of the sub-block loop 320 is methodically selected to be the second largest phase delay for an m phase clock signal, which is $(m-1/m)*2\pi$. The phase delay of a connection from a block in the main-loop 310 to a block in the sub-loop 320 (e.g. staircase connections in FIG. 3) is also the second largest phase delay for an m phase clock signal, which is $(m-2/m)*2\pi$. Given that the main-loop to sub-loop connections also incur delay, and the designs for some division ratios do not require main-loop to sub-loop connections (for instance the division ratio of 7), a design parameter for a division ratio may be the delay of connections between SAB blocks, rather than the number of SAB blocks in the main and sub-block loops. In other words, the smallest implementation is defined by the smallest number of connections between the SAB blocks as opposed to the implementation with the smallest number of SAB blocks.

In an example, let n1 be the number of SAB block to SAB block connections with the largest phase delay for an m phase clock signal, $(m-1/m)*2\pi$, occurring exclusively in the main-loop. Similarly, let n2 be the number of SAB block to SAB block connections with the second largest phase delay for an m phase clock signal, $(m-2/m)*2\pi$, occurring at the sub-loop and at the main-loop to sub-loop connections. For notational convenience, let such a proposed frequency divider be defined as an (n1, n2)-divider. A design objective may be to select the smallest (n1+n2) number of connections on the design topology template in FIG. 3.

In the following example, the number of multi-phase clock input signals m=8 is used for explanation and this number is also used in Section III to facilitate the simulations, although other numbers of input signals are of course possible. When m=8, the phase delays between adjacent SABs in the circuit loop are $7/8*2\pi$ and $6/8*2\pi$. Design principles of building a division ratio of r may be to select the smallest sum of the number of largest phase delay connections n1 and second largest phase delay connections n2. Mathematically, the total phase delay provided by the frequency divider can be expressed as:

$$n_1 * \left(\frac{7}{8}\right) * 2\pi + n_2 * \left(\frac{6}{8}\right) * 2\pi = r * 2\pi \qquad (2)$$

Thus, the relationship between n1, n2 and r may be:

$$7*n_1 + 6*n_2 = 8*r \qquad (3)$$

For a smallest number phase delay connections (n1+n2) to be used in division ratio of r on the proposed circuitry in FIG. 3, n2 should be constrained by n2<=6.

Proof of this may be through contradiction. If n2>=7, the frequency divider may be turned into a (n1+6; n2−7)-divider. The (n1+6; n2−7)-divider only requires n1+n2−1 blocks to construct a frequency divider, which is better for power savings than the original one.

For instance, the frequency dividers for division ratios r>=5, the circuit loop of dividers are comprised by no less than 6 blocks, which can easily be demonstrated to follow the n2<6 rule. For r=4, a (2, 3)-divider is used to facilitate the design and for r=3, a (0, 4)-divider is used to facilitate the design.

C. Dynamic RTWO Frequency Divider Circuit Implementation

Figure 4A:
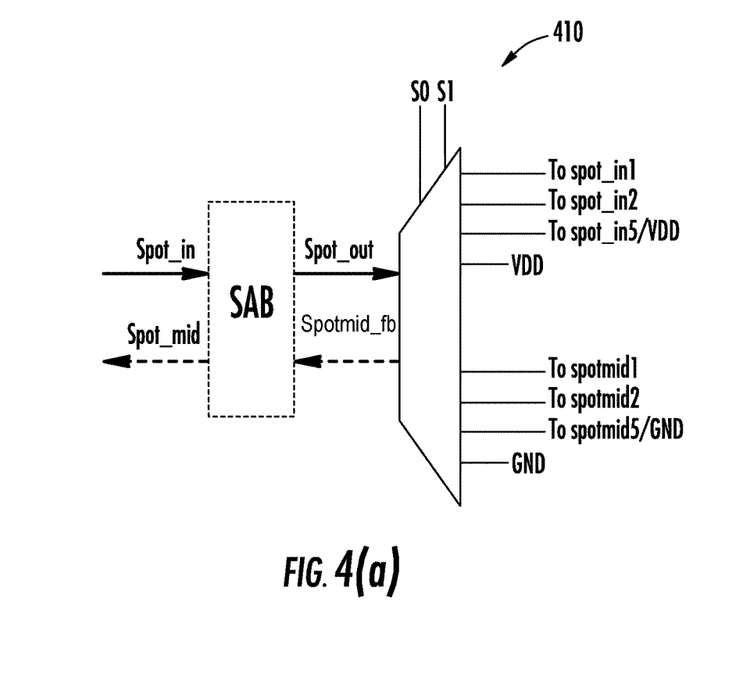
FIGS. 4(a) and 4(b) show a multi-output SAB and a multi-input SAB.
Figure 4B:
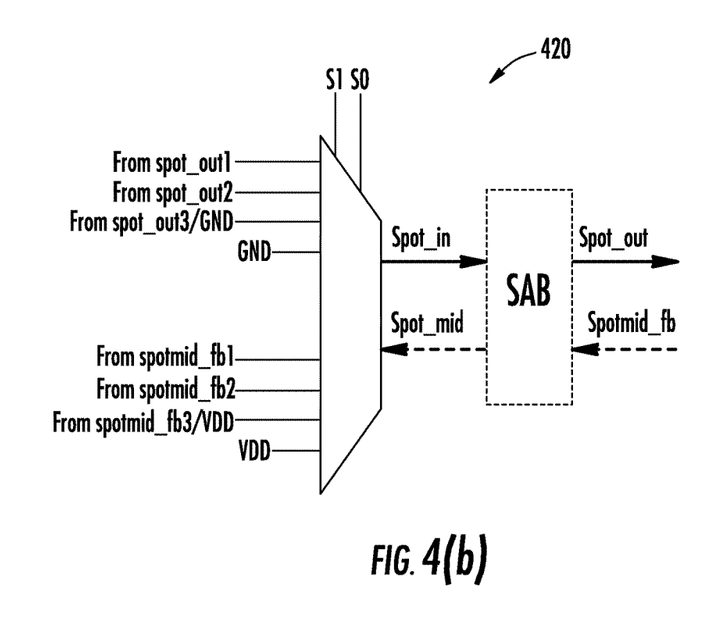

The topology shown in FIG. 3 is comprised of two parts: (1) The main-loop is comprised of 8 multi-output SABs (MOSAB) with $7/8*2\pi$ phase delay between adjacent stages. (2) The sub-loop is comprised of 5 multi-input SABs (MISAB) with $6/8*2\pi$ phase delay between adjacent stages. Both the MOSABs 410 and the MISABs 420 are comprised of an SAB and a 4-to-1 multiplexer as shown in FIGS. 4(*a*) and 4(*b*). Although 4-to-1 multiplexers are shown, other components such as gate constructions, may be used that multiplex and demultiplex functions of signals. They can be both be implemented with a multiplexer and a demultiplexer. They may be the exact same hardware components but also differ in how the inputs and outputs connected on the rotary ring. The hardware component may be implemented as a 4-1 MUX and a 1-4 DEMUX.

Figure 5A:
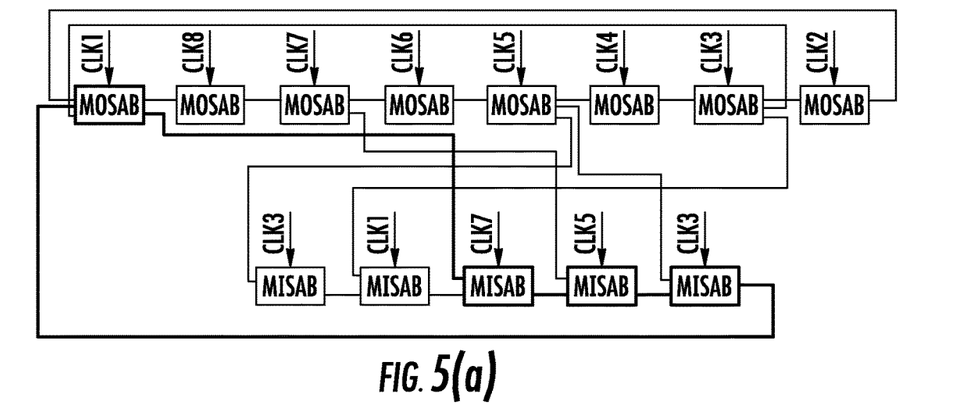
FIGS. 5(a) and 5(b) show a dynamic RTWO frequency divider.
Figure 5B:
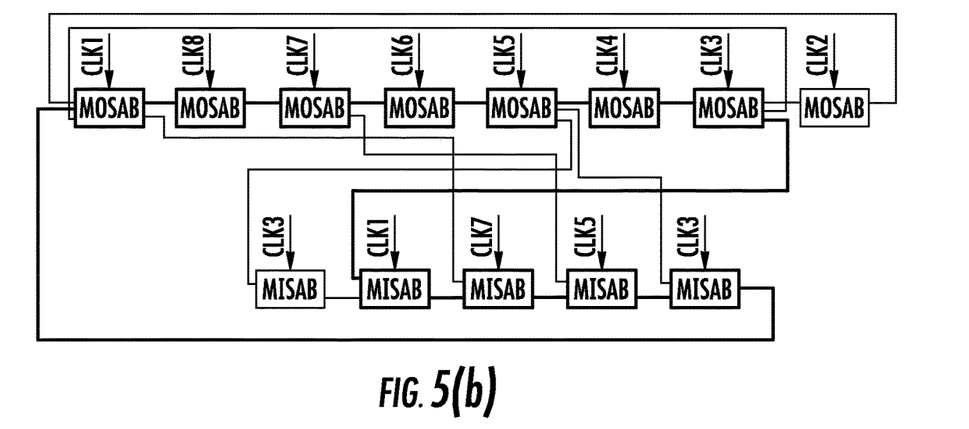

The multiple output SAB 410 is shown in FIG. 4(a). The spot-in signal is multiplexed, as desired to one of the four outputs, spot_in1, spot_in2, spot_in5/VDD or VDD. S0 and S1 are the two bit selection inputs of the multiplexer that designate the output port. The MOSAB is built to be used as a homogenously repeated element for the division circuit in FIG. 5. In order words, not all four outputs of the MUX may be necessary for each MOSAB instance in the divider circuit in FIG. 5. Demonstrated for a division by 3 to 9 circuit shown in FIG. 5, the MOSABs have the connections as shown in FIG. 4(a).

For instance, the spot_in1 output propagates the spot in signal to the MOSAB on the right, whereas spot_in2 is connected to the MOSAB two MOSABs to the right. For power savings purposes, not all MOSABS in the divider configuration need to be used in FIG. 5. Output VDD is used for this purpose of power savings, so is the output marked spot_in5/VDD, where the latter can be connected to VDD or a MOSAB five elements to the right, as necessary in the configuration. The MOSAB functionality also includes regulating the voltage on the MOSAB to the left of the MOSAB instance, which is performed through the Spot_mid output. S0S1 selection bits select the appropriate input from spotmid1, spotmid2, spotmiod5/GND and GND to multiplex to output spot-mid. Based on the connectivity of the MOSAB instance in FIG. 5 (i.e. based on the desired divisor), the spot_mid input of the MOSAB to the might need to be connected to the input from the output of MOSAB to the right, two MOSABS to the right 5 MOSABS to the right or GND, or reset to GND for power savings.

FIG. 4(b) shows the multi-input SAB, MISAB, 420. The connectivity of MISAB complements that of the MOSABs in terms of inputs and outputs: The spot_out is the output of the MISAB, multiplexed from spot_out1, spot_out2, spot_out3/GND and GND. The input spotmid_fb is multiplexed to one of the potential outputs spotmid_fb1, spotmid_fb2, spotmid_fb3/VDD or VDD, moderated by the S1S0 selection bits of the multiplexer. Note that unlike the generic MOSAB in FIG. 4(a), the generic MISAB does not connect to the MISAB in the fifth adjacent spot of the MISAB instance (i.e. in the selected division circuit in FIG. 5 of divisor value 3 to 9). Instead the third multiplexed input spot_out3/GND is from the MISAB instance three to the left.

MISABS and MOSABS may be designed with a 4-to 1 MUX to benefit from the 7/8 and 6/8*2pi phase selections in Equation (2). As shown in FIGS. 5(a) and 5(b), the MOSABs and MISABs are connected in a particular order to implement the range of division values for frequency. In FIG. 5, MOSABs have number of outputs ranging from 1 to 3, and MISABs have number of inputs ranging from one to 2. With the appropriate selection inputs S1S0 on the MUX for MOSAB and MISABs, the desired output and input connections (preconnected for division by 1 through 9 in FIGS. 5(a) and (b)), respectively, are enabled. For instance, the first MOSAB from the left in FIG. 5(a) can have one of two possible outputs: Either to MISAB3 (connected to CLK7) as in Division by r=3 (FIG. 5(a)) or to the second MOSAB from the left (connected to CLK8) as in division by r=9 (FIG. 5(b)). The seventh MOSAB from the left can have three outputs, and fourth output of full VDD (not shown), which is for power savings mode.

The multiplexer may be used to provide the dynamic frequency tuning capability. By changing the control inputs of the multiplexers, the connections among the MOSABs 410 in the main-loop 310 and the MISABs 420 in the sub-loop 320 may be reconfigured dynamically to facilitate the design for different division ratios. In addition, one or two of the channels of the multiplexer may be designed to temporarily reset its SAB in order to save power when the SAB is not used in the divider loop.

FIGS. 5(a) and 5(b) show two RTWO frequency dividers 510 for division ratios r=3 and r=9, accomplished by reconfiguring the loop for the desired division ratio. For r=3, as shown in FIG. 5(a), the phase delays between adjacent SABs are all 6/8*2π as such the divider is a (0, 4)-divider. FIG. 5(b) shows the loop for r=9, the divider is a (6, 5)-divider. The MOSABs and MISABs are pre-connected to realize division by 3 through 9 in this example. By dynamically selecting the appropriate connections for each MOSAB and MISAB (through MUX selection inputs not shown on FIGS. 5(l) and (b)), based on Equation(2) above, the desired division value can be selected. For instance, a division by r=3 in FIG. 5(a) requires no increments of 7/8*pi (n1=0) but 4 increments of 6/8*pi (4 times 6/8*pi is 3*pi). Similarly, to accomplish a division by r=9, the appropriate selection of n1 is 6 and n2 is 5 based on Equation 2. See in FIG. 5(b) that the First 6 MOSABs are connected to the MOSABs next to them whereas the $7^{th}$ MOSAB and the right-most four MISABS are dynamically reconfigured to generate 5 units of 6/8*pi delay and to be connected back to the leftmost MOSAB.

III. Experimental Use

An RTWO-based frequency divider was tested in HSPICE with a 90 nm technology. The following experiments were performed in the following two aspects: (1) The dynamic switching between different division ratios; (2) The power consumption of the frequency divider when building dividers with different division ratios.

A. Dynamically Tune the Division Ratio

Figure 6:
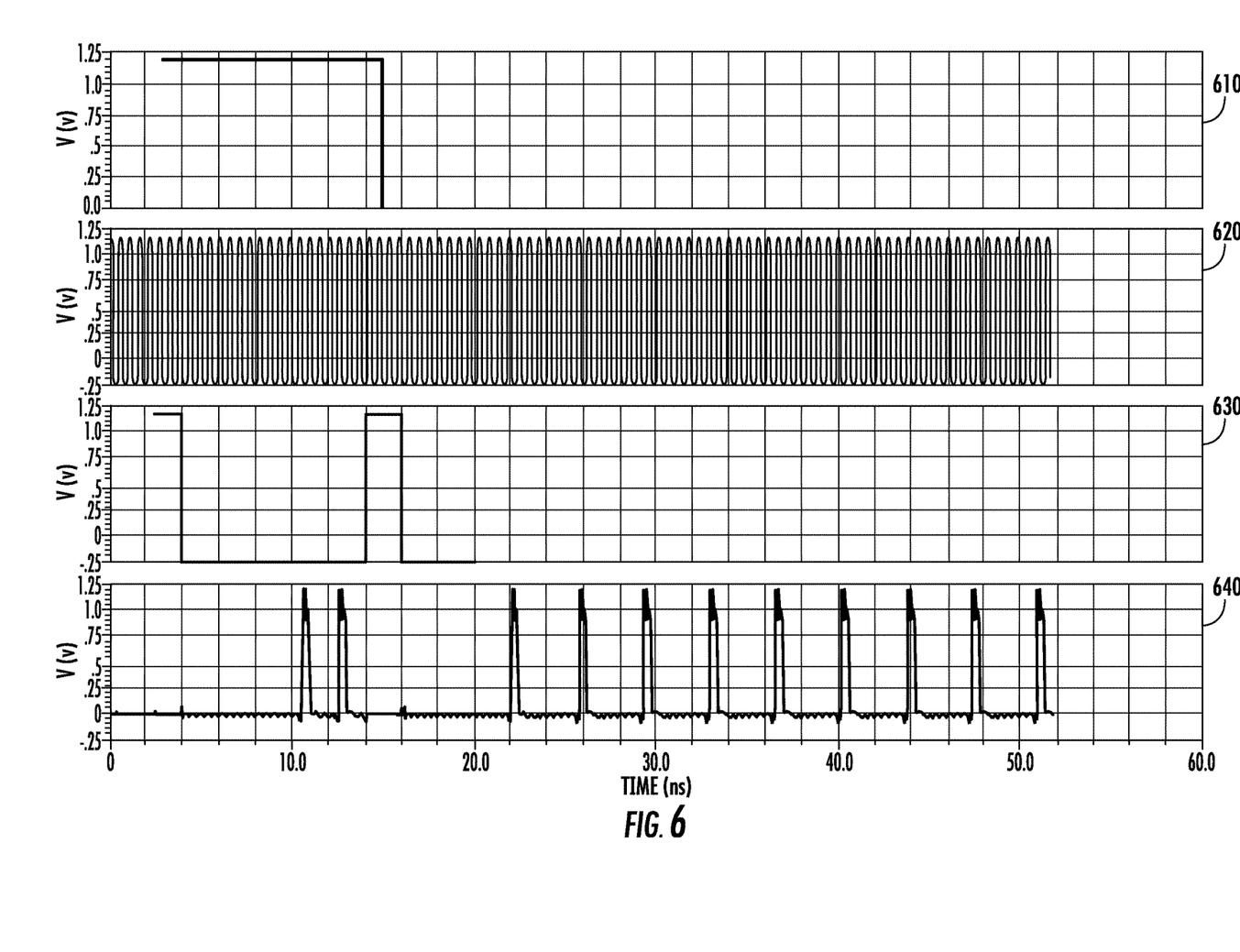
FIG. 6 shows dynamic switching of the division ratios between 5 and 9.

The frequency divider was designed to switch from division ratios r=5 to r=9. As shown in FIG. 6, the signal shown on top 610 is the switch signal, which is triggered around 15 ns. The second waveform 620 shows the input oscillation signal generated from the ring, which is around 2.5 GHz. The third waveform 630 shows the operation of the reset signal. In order to guarantee the functionality of the circuit after switching, the reset signal is turned on by the DFS controller. The waveform at the bottom 640 shows the output signal of the RTWO frequency divider divided by 5 before reset and by 9 after reset. The duty cycle of the output signal is decided by the largest available phase delay (7/8*2π in this case) of the input signals, and it is suitable for an edge triggered synchronous circuit design.

B. Performance of RTWO Frequency Dividers from the Same Core Frequency

The performance of the RTWO frequency dividers from an arbitrarily selected core frequency of 2.5 GHz is investigated for division ratios r=3 to r=9. The rising time of the input signals is 5% of the clock cycle.

Figure 7A:
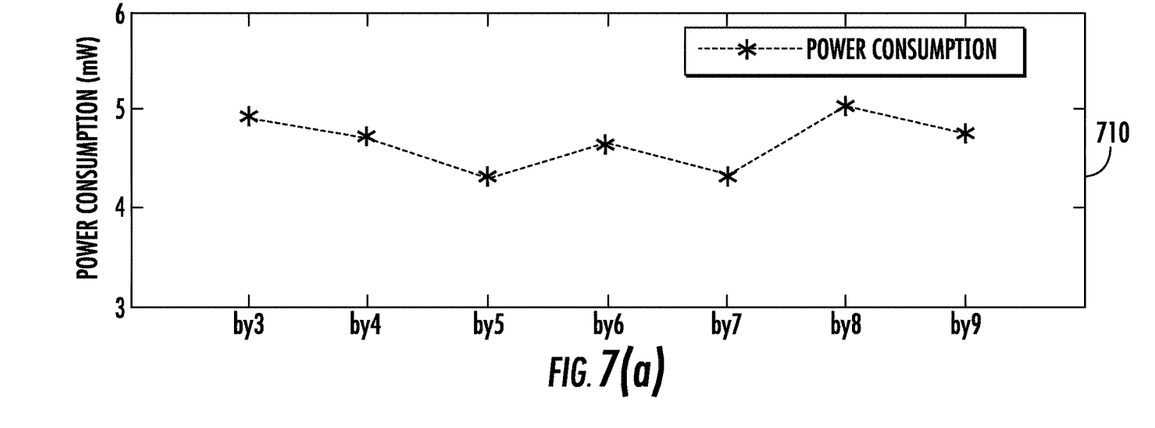
FIGS. 7(a) and 7(b) show power consumption of the RTWO frequency dividers for division ratios between 3-9.
Figure 7B:
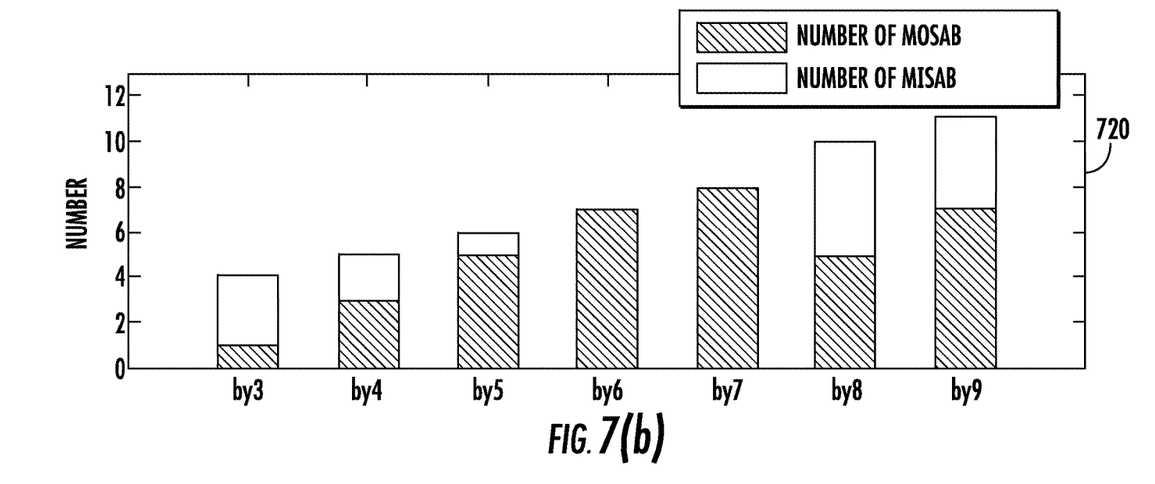

The line plot in FIG. 7(a) shows the power consumption of the frequency dividers for division ratios of 3 to 9. The frequency dividers maintain a steady power consumption between 4.31 mW to 5.05 mW. The number of MISABs and MOSABs that are used in each frequency divider is shown in the bar chart 720 of FIG. 7(b). The sum of MISABs and MOSABs used in each frequency divider increases monotonically along with the increasing of the division ratios because the maximum phase delay is kept between adjacent MISABs/MOSABs in each frequency divider loop. Along with increasing the division ratio, the output frequency decreases and the number of MOSABs and MISABs increases. The changing of these two factors neutralizes their efforts on the divider power consumption so as to increase the tuning range of the output frequency without increasing the power consumption.

In order to investigate the leakage power dissipation of the RTWO frequency divider, the leakage current was tested under the condition that the circuit is turned into reset mode and all the transistors in the circuit topology were shut off. Simulation results show that the leakage power consumption is 15.7 µW, which contributes to a negligible 0.3% of the power consumption of the RTWO frequency divider.

IV. Conclusion

A dynamic frequency divider design methodology for dynamic frequency scaling of resonant rotary clocking in modern processors. The proposed circuit topology may be used to design a dynamic RTWO frequency divider for integer division ratios of 3-9 within one circuit topology. The power consumption of the topology may be designed to be as low as around 5.05 mW when tuning the output frequency, and the leakage power dissipation is 15.7 µW when the circuit is turned into reset mode, demonstrating the power-efficiency of the design.

While the invention has been described with reference to the embodiments above, a person of ordinary skill in the art would understand that various changes or modifications may be made thereto without departing from the scope of the claims.

The invention claimed is:

1. A dynamic rotary traveling wave oscillator circuit comprising:
   a plurality of multi-output spot-advancing blocks (MOSABs) forming a main-loop;
   a plurality of multi-input spot-advancing blocks (MISABs) forming a sub-loop;
   wherein depending on a desired division ratio, a connection connects blocks on the MOSABs and MISABs to create the desired division ratio;
   wherein the MOSABs and the MISABs comprise components that perform multiplexing of signals.

2. The dynamic rotary traveling wave oscillator circuit of claim 1, wherein the components comprise gates.

3. The dynamic rotary traveling wave oscillator circuit of claim 1, wherein the components perform demultiplexing of signals.

4. The dynamic rotary traveling wave oscillator circuit of claim 3, wherein the components comprise a multiplexer that multiplexes signals and a demultiplexer that demultiplexes signals.

5. The dynamic rotary traveling wave oscillator circuit of claim 1, wherein the components comprise one of four outputs, spot_in1, spot_in2, spot_in5/VDD, or VDD.

6. The dynamic rotary traveling wave oscillator circuit of claim 5, wherein spot_in5/VDD can be connected to VDD or a MOSAB to conserve power.

7. The dynamic rotary traveling wave oscillator circuit of claim 1, wherein use of MOSABS in a divider configuration is determined based on power conservation.

8. The dynamic rotary traveling wave oscillator circuit of claim 1, wherein one MOSAB regulates the voltage on an adjacent MOSAB through a Spot_mid output.

9. The dynamic rotary traveling wave oscillator circuit of claim 1, further comprising a spot-in signal that is multiplexed by the components.

10. The dynamic rotary traveling wave oscillator circuit of claim 9, wherein the spot-in signal is multiplexed by the components to one of the four outputs, spot_in1, spot_in2, spot_in5/VDD or VDD.

11. The dynamic rotary traveling wave oscillator circuit of claim 10, wherein the components comprise two bit selection inputs of the multiplexer that designate one of the four output ports.

12. The dynamic rotary traveling wave oscillator circuit of claim 1, wherein given m number of multi-phase input clock signals that drive the main-loop and sub-loop blocks, the largest phase delay between the multi-phase input clock signals is $(m-1/m)*2\pi$, and wherein the phase delays of the sub-loop is selected to be the second largest phase delay for an m phase clock signal, which is $(m-1/m)*2\pi$, and wherein the phase delay of a connection from a block in the main-loop to a block in the sub-loop is the second largest phase delay for an m phase clock signal, which is given by $(m-2/m)*2\pi$.

13. The dynamic rotary traveling wave oscillator circuit of claim 1, wherein the circuit is a 13 stage circuit topology comprising 8 main-loop stages and 5 sub-loop stages.

14. The dynamic rotary traveling wave oscillator circuit of claim 13, wherein the 8 main-loop stages comprise 8 MOSABs with $7/8*2\pi$ phase delay between adjacent MOSAB stages.

15. The dynamic rotary traveling wave oscillator circuit of claim 14, wherein the 5 sub-loop stages comprise 5 MISABs with $6/8*2\pi$ phase delay between adjacent MISAB stages.

* * * * *